(12) United States Patent
White

(10) Patent No.: US 7,567,642 B2
(45) Date of Patent: Jul. 28, 2009

(54) PHASE DETECTOR WITH EXTENDED LINEAR OPERATING RANGE

(75) Inventor: Peter John White, Cheltenham (AU)

(73) Assignee: Analog Devices, Inc., Norwood, MA (US)

( * ) Notice: Subject to any disclaimer, the term of this patent is extended or adjusted under 35 U.S.C. 154(b) by 769 days.

(21) Appl. No.: 11/022,019

(22) Filed: Dec. 23, 2004

(65) Prior Publication Data

US 2005/0185747 A1 Aug. 25, 2005

(30) Foreign Application Priority Data

Dec. 23, 2003 (AU) .............................. 2003907122
Jan. 5, 2004 (AU) .............................. 2004900014
Jan. 6, 2004 (AU) .............................. 2004900020

(51) Int. Cl.
*H03D 3/24* (2006.01)

(52) U.S. Cl. ....................... 375/376; 375/236; 375/294; 375/327; 375/331; 375/373

(58) Field of Classification Search ................. 375/376, 375/236, 294, 327, 331, 373
See application file for complete search history.

(56) References Cited

U.S. PATENT DOCUMENTS

| | | | |
|---|---|---|---|
| 3,571,743 A | 3/1971 | Menkes | |
| 3,714,463 A | 1/1973 | Laune | |
| 4,027,262 A | 5/1977 | Sharpe | |
| 4,151,485 A * | 4/1979 | LaFratta | ..................... 331/1 A |
| 4,500,852 A | 2/1985 | Phillips | |
| 4,516,250 A | 5/1985 | Grimes | |
| 4,561,014 A * | 12/1985 | Douziech et al. | ............ 348/507 |
| 4,888,564 A | 12/1989 | Ishigaki | |
| 4,902,920 A | 2/1990 | Wolaver | |
| 5,254,959 A | 10/1993 | Wunsch | |
| 5,315,269 A | 5/1994 | Fujii | |
| 5,521,948 A | 5/1996 | Takeuchi | |
| 5,550,515 A | 8/1996 | Lang et al. | |
| 5,856,761 A | 1/1999 | Jokura | |
| 5,952,853 A | 9/1999 | Willingham et al. | |
| 6,078,634 A | 6/2000 | Bosshart | |
| 6,265,902 B1 | 7/2001 | Klemmer et al. | |
| 6,486,741 B2 | 11/2002 | Sumi | |
| 6,522,183 B2 | 2/2003 | Sumi | |
| 6,636,979 B1 * | 10/2003 | Reddy et al. | ................. 713/503 |
| 2003/0042948 A1 | 3/2003 | Sumi | |

* cited by examiner

*Primary Examiner*—Shuwang Liu
*Assistant Examiner*—Kabir A Timory
(74) *Attorney, Agent, or Firm*—Wolf, Greenfield & Sacks, P.C.

(57) ABSTRACT

A method and apparatus for extending the linear range of a phase detector. In one embodiment, a limited range phase difference is generated between selected edges of first and second input signals, and an excursion of the limited range phase difference beyond a predetermined threshold is detected. In response to detecting the excursion of the limited range phase difference beyond a threshold, an edge of the first or second input signal is prevented from influencing subsequent generation of the limited range phase difference, and a compensated phase difference is generated, derived from the limited range phase difference and including a correction component which compensates for the effect of preventing said edge from influencing subsequent generation of the limited range phase difference.

26 Claims, 12 Drawing Sheets

PHASE DETECTOR WITH EXTENDED LINEAR OPERATING RANGE

RELATED APPLICATIONS

This application claims the benefit under 35 U.S.C. §119 (a)-(d) of Australian Provisional Application No. 2003907122 filed on Dec. 23, 2003, Australian Provisional Application No. 2004900014 filed on Jan. 5, 2004, and Australian Provisional Application No. 2004900020 filed on Jan. 6, 2004.

BACKGROUND OF INVENTION

1. Field of Invention

The invention relates to phase detectors and more specifically to an enhanced phase detector with an extended linear operating range.

2. Background

Numerous circuits employ phase detectors to determine the phase difference between two input signals. For example, phase locked loops (PLLs) are popular circuits which utilize a phase detector which compares the phase of two signals and generates a phase error signal. The phase detector in a PLL compares a reference signal with the output of a voltage controlled oscillator (possibly after passing through a frequency divider), and outputs a phase error signal. Typically, the phase error signal is filtered by a loop filter and fed into the voltage controlled oscillator, which generates a signal whose frequency varies based on the filtered phase error signal. The output signal of the voltage controlled oscillator is then fed back into the phase detector (via a frequency divider, if a frequency divider is utilized), completing a feedback loop. After an acquisition time, the reference signal and the output signal of the voltage controlled oscillator are equal in frequency and typically possess a small or zero phase offset. In such a state, the PLL is said to be in a "locked" condition, and the output signal of the voltage controlled oscillator is phase locked to the reference signal.

Numerous phase detectors possess a limited linear phase detection range, beyond which cycle slip occurs and degrades PLL acquisition time and modulation capability. As such, phase detectors, and applications comprising phase detectors, may benefit from an extended linear phase detection range.

SUMMARY OF INVENTION

In some embodiment, the invention operates with any type of edge sensitive conventional phase detector that has a linear range greater than or equal to $2\pi$ radians. Each edge arriving at the conventional phase detector input is representative of a full cycle, or $2\pi$ radians, of phase. In one embodiment, the linear range of the conventional phase detector is divided into a smaller sub-range. When the phase error falls outside this sub-range, a $2\pi$ radians phase adjustment is made to move the output of the phase detector back toward the sub-range, by removing, or not responding to, one of the next input pulse edges. At the same time that the edge is removed or ignored, a $2\pi$ radians adjustment is made to the conventional phase detector output to compensate. The result is an enhanced phase detector with a practical linear range that may be made arbitrarily wide.

In various embodiments, a method of generating a signal indicative of a phase difference between a first input signal and a second input signal, the first input signal comprising a first sequence of edges, and the second input signal comprising a second sequence of edges, the method comprising generating a limited range phase difference between selected edges of the first and second input signals, detecting an excursion of the limited range phase difference beyond a predetermined threshold, in response to detecting the excursion of the limited range phase difference beyond a threshold, preventing an edge of the first or second input signal from influencing subsequent generation of the limited range phase difference, and generating a compensated phase difference derived from the limited range phase difference and including a correction component which compensates for an effect of preventing an edge of the first or second input signal from influencing subsequent generation of the limited range phase difference.

In some embodiments, a phase detector circuit which generates a signal indicative of a phase difference between a first input signal and a second input signal, the first input signal comprising a first sequence of edges, and the second input signal comprising a second sequence of edges, comprising means for generating a limited range phase difference between selected edges of the first input signal and the second input signal, means for determining if the limited range phase difference between selected edges of the first input signal and the second input signal exceeds a predetermined threshold, means for preventing an edge of the first or second input signal from influencing subsequent generation of the limited range phase difference, and means for compensating the limited range phase difference, thereby generating a signal indicative of the phase difference between the first input signal and the second input signal.

In some embodiments, a phase detector circuit configured to generate a signal indicative of a phase difference between a first input signal and a second input signal, the first input signal comprising a first sequence of edges, and the second input signal comprising a second sequence of edges, comprising a limited range phase detector generating a limited range phase difference responsive to a first intermediate signal and a second intermediate signal, a threshold detector determining if the limited range phase difference between selected edges of the first input signal and the second input signal exceeds a predetermined threshold, wherein a first input of the threshold detector receives the first input signal and a second input of the threshold detector receives the second input signal, the threshold detector provides a first output when the limited range phase difference exceeds a leading threshold and the selected edges of the first input signal lead the selected edges of the second input signal, and the threshold detector provides a second output when the limited range phase difference exceeds a lagging threshold and the selected edges of the first input signal lag the selected edges of the second input signal, a first edge gate connected to receive the first input signal and output the first intermediate signal, the first intermediate signal including edges of the first input signal except for one or more edges of the first input signal, blocked by the first edge gate in response to a signal applied to a control terminal of the first edge gate from the first output of the threshold detector, and a second edge gate connected to receive the second input signal and output the second intermediate signal, the second intermediate signal including edges of the second input signal except for one or more edges of the second input signal, blocked by the second edge gate in response to a signal applied to a control terminal of the second edge gate from the second output of the threshold detector.

In various embodiments, in a phase locked loop having a phase detector, a loop filter and a voltage controlled oscillator arranged in a feedback loop, the improvement comprising the phase detector implementing a method of generating a signal indicative of a phase difference between a first input signal and a second input signal, the first input signal comprising a first sequence of edges, and the second input signal comprising a second sequence of edges, the method comprising (a) generating a limited range phase difference between selected edges of the first and second input signals, (b) detecting an excursion of the limited range phase difference beyond a predetermined threshold, (c) in response to detecting the excursion of the limited range phase difference beyond a threshold, preventing an edge of the first or second input signal from influencing subsequent generation of the limited range phase difference, and (d) generating a compensated phase difference derived from the limited range phase difference and including a correction component which compensates for an effect of preventing an edge of the first or second input signal from influencing subsequent generation of the limited range phase difference.

BRIEF DESCRIPTION OF DRAWINGS

The accompanying drawings are not intended to be drawn to scale. In the drawings, each identical or nearly identical component that is illustrated in various figures is represented by a like identifier. For purposes of clarity, not every component may be labeled in every drawing. In the drawings.

DETAILED DESCRIPTION

Figure 1:
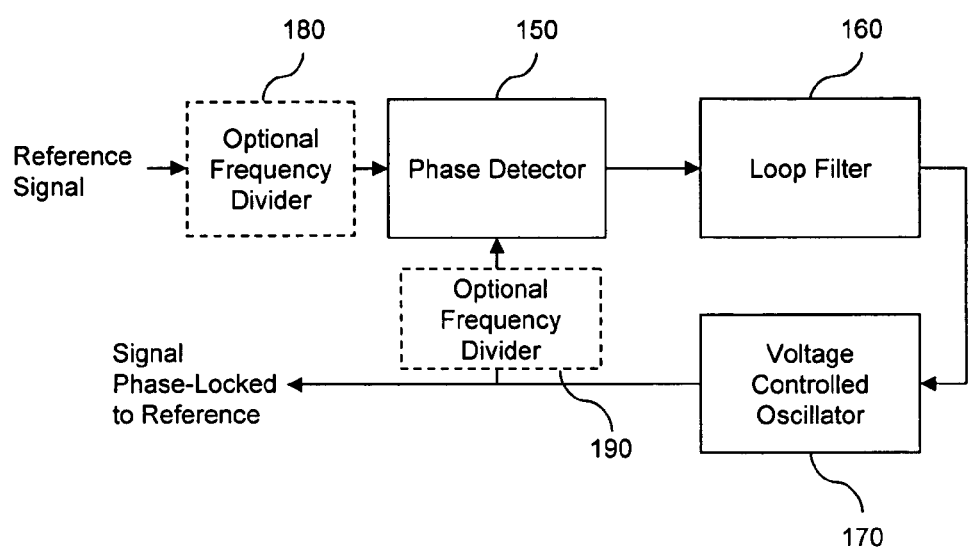
FIG. 1 is a circuit block diagram of a conventional, prior art phase locked loop circuit.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

As illustrated in FIG. 1, a typical PLL comprises a phase detector 150, comprising one or more latches and gates, receiving a reference signal and an output signal of a voltage controlled oscillator 170. The phase detector 150 determines a phase error signal between the reference signal and the output signal of the voltage controlled oscillator 170.

The phase error signal is typically fed into a loop filter 160 which may comprise a low pass filter with an appropriate bandwidth. The output of the loop filter 160 is fed into a voltage controlled oscillator 170 which outputs a signal whose frequency depends on an input (i.e., control) signal. The output signal from the voltage controlled oscillator 170 is then fed back into the phase detector 150, completing a feedback loop. Due to the feedback, after an acquisition time, the voltage controlled oscillator 170 output signal is phase-locked to the reference signal and both signals possess the same phase and frequency.

Optionally, the PLL may also comprise a 1/M frequency divider 180 receiving the reference signal and generating an output signal, with a frequency equal to the reference frequency divided by M, that is in turn fed into the phase detector 150. Similarly, an optional 1/N frequency divider 190 may modify the output of the voltage controlled oscillator 170 prior to input into the phase detector 150. In general, a PLL may include only the frequency divider 180, only the frequency divider 190, both frequency dividers 180 and 190, or neither frequency dividers 180 and 190. Additionally, the PLL may also include frequency translation loops, comprising mixers, which are well known to those skilled in the art.

Figure 2:
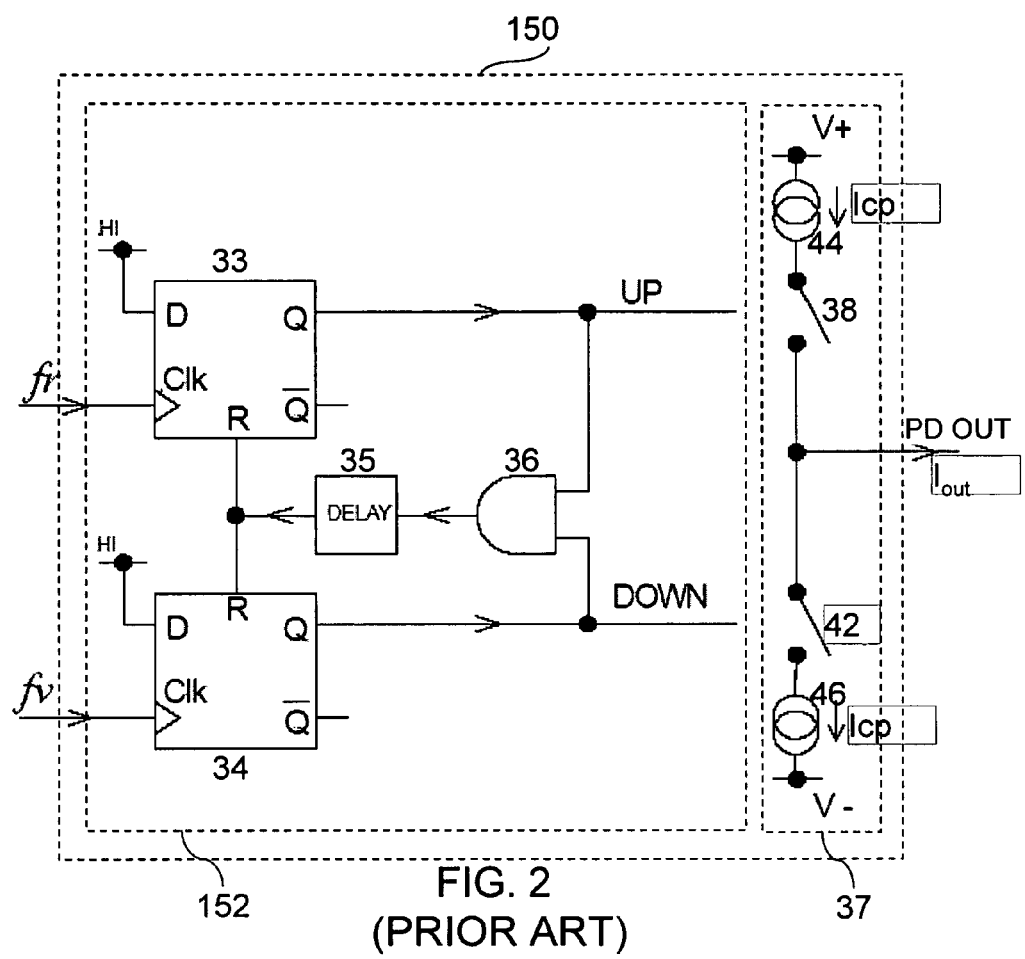
FIG. 2 is a circuit block diagram of a conventional phase detector.

The illustration in FIG. 2 shows a typical implementation of a phase detector 150, comprising a digital phase frequency detector (PFD) 152 and a current pump 37, receiving two input signals fr and fv and outputting a phase error signal on an output terminal PD OUT based on the phase difference between the input signals.

The PFD 152 comprises a first latch 33, wherein the D terminal of the first latch 33 is connected to a high logic state and the clock terminal of the first latch 33 receives the fr input signal. The PFD 152 also comprises a second latch 34, wherein the D terminal of the second latch 34 is also connected to a high logic state and the clock terminal of the second latch 34 receives the fv input signal. In this example, the first and second latches, 33 and 34, activate on the rising edge of the clock signal, but other implementations may utilize latches that activate on a falling clock edge.

The current pump 37 comprises first and second electrically controlled switches 38 and 42, and first and second current sources 44 and 46, wherein the first current source 44 is connected to a high voltage and the second current source 46 is connected to a low voltage. The Q output of the first latch 33 is connected to the control terminal of the first switch 38 of the current pump 37 via the UP line. The Q output of the second latch 34 is connected to the control terminal of the second switch 42 of the current pump 37 via the DOWN line. The PFD 150 also comprises an AND gate 36 wherein a first input of the AND gate 36 is connected to the UP line and a second input of the AND gate 36 is connected to the DOWN line. The output of the AND gate 36 is connected via a DELAY element 35, and an output of the DELAY element 35 is connected to reset (R) input terminals of the first latch 33 and the second latch 34. The output of the charge pump 37 serves as an output terminal, designated as PD OUT. If the PD OUT terminal is connected to one terminal of a capacitor having a second terminal connected to ground, the current pump 37 will develop a corresponding voltage on the PD OUT terminal.

The phase detector 150, comprising the PFD 152, receives the two input signals, fr and fv, and outputs a phase error signal based on the phase difference between the two input signals. The input signals, fr and fv, may differ in frequency, phase, or both frequency and phase. The output signal $I_{out}$ at the PD OUT terminal may be in one of three states possessing a current of either $+I_{cp}$, $-I_{cp}$, or no current.

Specifically, the PD OUT terminal carries a current of $+I_{cp}$ when the rising edge of the input signal fr leads the corresponding rising edge of the input signal fv. In contrast, in cases where the rising edge of fr lags the rising edge of fv, the PD OUT terminal carries a negative current $I_{cp}$. Finally, a current output of zero on the PD OUT terminal occurs after corresponding rising edges of the fr and fv input signals have been processed so as to yield a phase error output signal, and the phase detector 150 has not yet received a next rising edge of the input signal fr or the input signal fv.

Therefore, the current output of the phase detector 150 is a pulsed signal, wherein the length of the pulses therein correlates to the phase error between consecutive rising edges of the two input signals fr and fv, and the sign of the pulses (negative or positive) conveys information as to whether the rising edge of the input signal fr leads or lags the rising edge of the input signal fv. The average current is indicative of the phase difference between the two input signals fr and fv. It should be appreciated that although the abovementioned example employs rising-edge-triggered latches, falling-edge-triggered latches may also be used, and in such an implementation, the phase error information would then be determined with respect to the falling edges of the input signals.

The output of the phase detector 150 for a case where the input signals fv and fr have the same frequency and a fixed phase offset, is shown in FIG. 2, indicating that the phase detector 150 has a linear range of $-2\pi$ to $+2\pi$ radians of phase difference. Outside this linear range, cycle slips occur and result in significant phase errors. There are many instances in the operation of a phase locked loop where this limited range of linear operation of the phase detector degrades or restricts performance. If the phase difference between the input signals fr and fv exceeds the $-2\pi$ to $+2\pi$ range then a cycle slip occurs, generally resulting in a $2\pi$ radian error in the output of the phase detector 150.

In the embodiments that follow, the linear range of a limited range phase detector, also referred to as a basic phase detector, is extended, thereby alleviating this problem. In a number of embodiments it is determined when a basic phase detector is heading beyond the linear area, to move the operation of the conventional phase detector in the opposite direction in the phase domain. This is done by blocking the next appropriate edge in fv or fr from entering the conventional phase detector, while simultaneously using that edge to make a $2\pi$ radian phase adjustment at the output of the phase detector. In various embodiments, the output of the limited range phase detector is sometimes referred to as a limited range phase difference, so as to distinguish over the adjusted phase difference, also referred to as the compensated phase difference.

Figure 3:
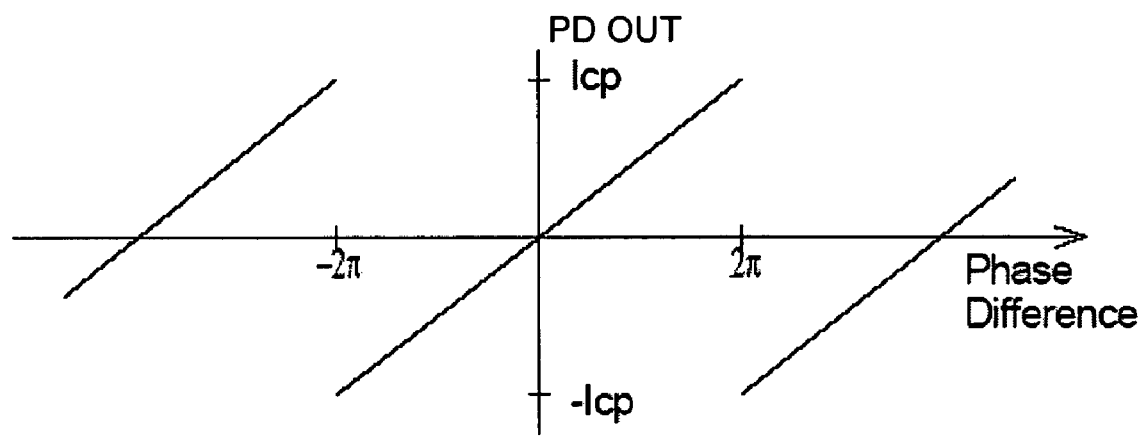
FIG. 3 is a graph of a conventional phase detector possessing a linear range of $-2\pi$ to $+2\pi$ radians of phase difference.
Figure 4:
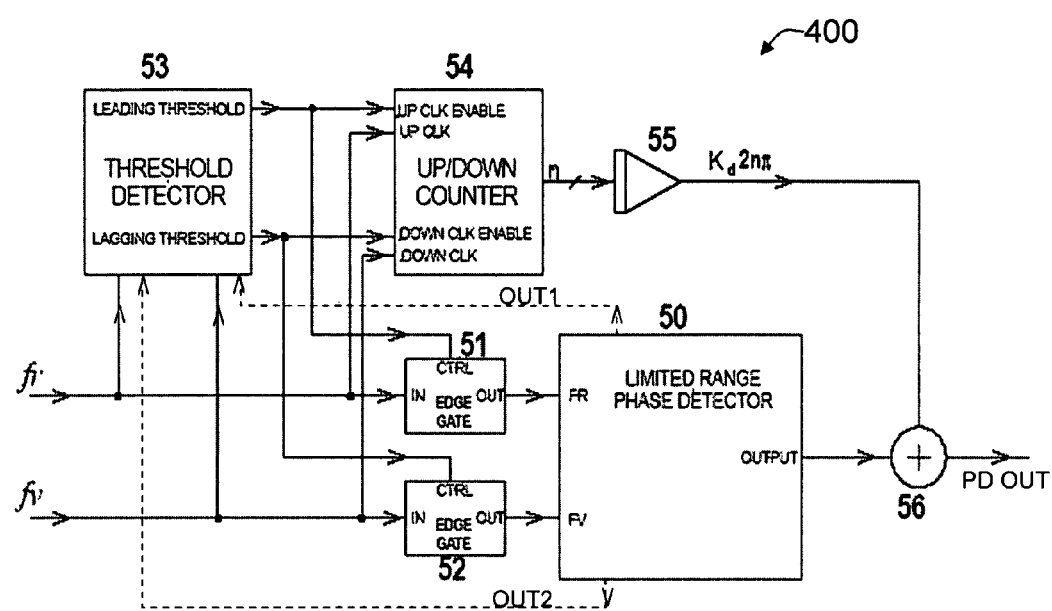
FIG. 4 is a conceptual block diagram of an enhanced phase detector possessing an extended linear range.

A conceptual block diagram 400 for some embodiments of an enhanced phase detector, extending the linear range of a limited range phase detector 50, is illustrated in FIG. 4. The limited range phase detector 50 may comprise any phase detector possessing a linear range of greater than or equal to $2\pi$ radians. In addition, in this example the limited range phase detector 50 is edge sensitive and outputs a current or voltage signal representing the phase difference between rising edges (or falling edges) of a first input signal fr and a second input signal fv. For example, the limited range phase detector 50 may comprise the PFD shown in FIG. 2. In such an example, the limited range phase detector 50 would possess a linear range of $-2\pi$ to $+2\pi$ radians, as illustrated in FIG. 3.

The limited range phase detector 50 may posses a gain constant $K_d$, such that the output of the limited range phase detector 50 is $K_d\phi_e$; $\phi_e$ represents the phase difference between the first input signal fr and the second input signal fv, and is only valid over the linear range of the limited range phase detector 50. In the case where the limited range phase detector 50 comprises the PFD illustrated in FIG. 2, the gain constant $K_d$ of the limited range phase detector 50 equals $I_{cp}/2\pi$.

The conceptual block diagram 400 of the enhanced phase detector comprises two input terminals, a first input terminal receiving a first input signal fr, and a second input terminal receiving a second input signal fv. The first input signal fr serves as an input to a first edge gate 51, and the output of the first edge gate 51 serves as a first input signal of the limited range phase detector 50. Similarly, the second input signal fv serves as an input to a second edge gate 52, and the output of the second edge gate 52 serves as a second input of the limited phase range detector 50. An edge gate may comprise any device(s) that pass(es) the edges of the input signal to the output of the edge gate in response to a first control signal and in response to a second control signal, blocks the edges of the input signal are blocked from passing through to the output of the edge gate.

The conceptual block diagram 400 of the enhanced phase detector also comprises a threshold detector 53. The threshold detector 53 comprises a first input which receives the first input signal fr and a second input which receives the second input signal fv. Optionally, the threshold detector 53 may also comprise a third input which receives a signal generated within the limited range phase detector 50 and a fourth input which receives another signal generated within the limited range phase detector 50 (indicated at dashed lines OUT1 and OUT2, respectively). For example, in the case where the limited range phase detector 50 comprises the PFD shown in FIG. 2, the third input of the threshold detector may be connected to the UP line of the PFD, and the fourth input of the threshold detector may be connected to the DOWN line of the PFD, thereby allowing the threshold detector 53 the opportunity to utilize phase difference signals residing within the limited range phase detector 50. It should be appreciated though, that the embodiments are not limited to such an implementation, and the threshold detector 53 need not necessarily utilize phase difference signals residing within the limited range phase detector 50.

The threshold detector 53 determines whether the phase difference between the input signals exceeds a leading threshold value, in the case where the first input signal fr leads the second input signal fv (denoted by a positive phase difference), or a lagging threshold value, in the case where the first input signal fr lags the second input signal fv (denoted by a negative phase difference). The threshold detector 53 also comprises a leading threshold output which provides the second control signal when the positive phase difference exceeds the leading threshold value, and a lagging threshold output which provides the second control signal level when the negative phase difference exceeds the lagging threshold value.

Furthermore, when the leading threshold output provides the second control signal, the edges of the first input signal fr are blocked from passing through to the output of the edge gate 51. In contrast, when the leading threshold output provides the first control signal, the edges of the first input signal fr are passed through to the output of the edge gate 51.

Similarly, when the lagging threshold output provides the second control signal, the edges of the second input signal fv are blocked from passing through to the output of the edge gate 52. In contrast, when the lagging threshold output provides the first control signal, the edges of the second input signal fv are passed through to the output of the edge gate 52.

The block diagram 400 of the enhanced phase detector also comprises a counter 54 which is incremented and decremented based on the number of times the phase difference exceeds the leading and lagging threshold values. The counter 54 may comprise a number of inputs. In some embodiments, the counter 54 may possess an UP clock enable input, a DOWN clock enable input, an UP clock input, and a DOWN clock input. In various embodiments the counter may possess a subset of the aforementioned inputs.

The UP clock enable input of the counter 54 is connected to the leading threshold output of the threshold detector 53. The DOWN clock enable input of the counter 54 is connected to the lagging threshold output of the threshold detector 53. The UP clock input of the counter 54 receives the first input signal fr, and the DOWN clock input of the counter 54 receives the second input signal fv. The output of the counter 54 may comprise multiple lines, outputting a digital representation of the count value n. In the case where the output of the counter comprises a digital representation, the output of the counter may be connected to the input of a digital-to-analog converter (DAC) 55 which converts the digital representation of the count value n into an analog signal, and optionally amplifies the signal by a gain value of $K_d 2\pi$, resulting in an output signal of $K_d 2n \pi$.

The block diagram 400 of the enhanced phase detector also comprises a summing element 56, comprising a first input which receives the output of the limited range phase detector 50 and a second input which receives the output of DAC 55. The summing element 56 adds the aforementioned outputs and generates a phase detector output signal at the PD OUT terminal. In this embodiment, the summing element 56 adds analog signals, but in other embodiments, the system may be modified so that the summing element 56 adds digital signals and the output of the summing element 56 may then be converted to an analog signal. One such embodiment may involve eliminating the DAC 55, and adding the digital output of the counter 54 with a digital output from a modified limited range phase detector, where the modified limited range phase detector is modified so as to generate a suitable digital representation at its output. For example, the digital output from a modified limited range phase detector may be derived from signals on the UP and DOWN lines of a conventional PFD 152. The composite digital signal formed by adding the digital output of the counter 54 with the digital output from the modified limited range phase detector may be converted to analog form to represent the phase difference.

It should be noted that in the case where the control terminals of the edge gates 51 and 52 are set to the first logic level, and the output of the counter 54 is zero, the enhanced phase detector represented by block diagram 400 operates in the same as an isolated limited range phase detector 50. In general, the operation of an enhanced phase detector based on the conceptual block diagram of FIG. 4 is described below.

When fr leads fv, then the limited range phase detector 50 indicates a positive phase difference. As the limited range phase detector 50 is an edge-sensitive phase detector, the amount by which fr leads fv can be measured by the time delay between an fr edge and the next fv edge. The threshold detector 53 detects when this phase difference exceeds a preset amount. If the period of the fr signal is $\tau_r$, then this threshold desirably may be set at 50% of $\tau_r$ (or some other fraction), so that if the fv edge following an fr edge occurs more than $0.5\tau_r$ after the fv edge, then the threshold is executed. This threshold does not have to be set to 50% and the invention provides useful operation over a wide range of threshold settings. The threshold does not have to be a fixed fraction of the period of fr; it can be derived in other ways, for example a fixed time interval, or related to the fv period. The threshold should be set so that the threshold is activated before the phase detector 50 enters its non-linear area.

When fr lags fv then the phase detector 50 indicates a negative phase difference. The threshold detector 53 detects when the magnitude of this phase difference exceeds a preset level denoted by the lagging threshold. If the period of the fv signal is $\tau_v$, then this threshold may be set at 50% of $\tau_v$, so that if the ft edge following an fv edge occurs more than $0.5\tau_v$ after the fr edge, then the threshold is activated. Again this threshold does not have to be set to 50% of $\tau_v$ and can be defined in other ways, and it does not have to be equal to the leading threshold setting. As with the leading threshold, the lagging threshold should be set so that the threshold is activated before the phase detector 50 enters its non-linear area, and good performance may be obtained over a wide range of threshold settings.

When the phase difference between fr and fv is small, neither threshold is exceeded and phase detector 400 operates as the conventional phase detector 50 in isolation. During any form of acquisition, as the phase difference increases, but before the phase detector 50 goes out of its linear range, one of the thresholds is exceeded and one of the threshold signals from 53 is activated.

For example, if fr is leading fv, the activation of the leading threshold signal from threshold detector 53 causes the edge gate 51 to block the next fr edge from entering the conventional phase detector 50. This removes $2\pi$ radians of phase difference from the signals entering 50, thus the output of 50 will from then on reflect the loss of $2\pi$ radians of phase. At the same time that the gate 51 blocks the edge on theft signal from reaching 50, the counter 54 is enabled to count UP and the same fr edge that was excluded from 50 clocks the counter 54, causing the output n to increase by 1. In turn, this increases the output of the DAC 55 by $K_d 2\pi$ radians, which is added to the phase detector output in summing element 56, exactly compensating for the $2\pi$ radian loss in phase caused by blocking the fr edge in the edge gate 51.

Similarly, if fr is lagging fv, the activation of the lagging threshold signal from threshold detector 53 causes the edge gate 52 to block the next fv edge from entering the conventional phase detector 50. This removes $-2\pi$ radians of phase difference from the signals entering 50, thus the output of 50 will from now on reflect the loss of $-2\pi$ radians of phase. At the same time that the gate 52 blocks the edge on the fv signal from reaching 50, the counter 54 is enabled to count DOWN and the same fv edge that was excluded from phase detector 50 clocks the counter 54, causing the output n to decrease by 1; in turn, this decreases the output of the DAC 55 by $-K_d 2\pi$ radians, which is added to the phase detector output in summing element 56, exactly compensating for the $-2\pi$ radian loss in phase caused by blocking the fv edge in the edge gate 51.

In some embodiments, it may be preferable to have the counter 54 saturate rather than cycle, so that if N is the maximum count of the counter, the next UP clock pulse causes the counter to stay on N rather than cycle to the minimum value. Similarly for the down pulses, the counter may saturates at the most negative output.

In some embodiments, it is further noted that the DAC output may be scaled differently relative to the phase detector 50 in order to provide additional phase detector gain during acquisition.

It should be appreciated that the conceptual block diagram of FIG. 4 illustrates a functional representation of the embodiments, and therefore numerous implementations are possible, which need not be limited by the connections depicted in the diagram of FIG. 4.

Figure 5:
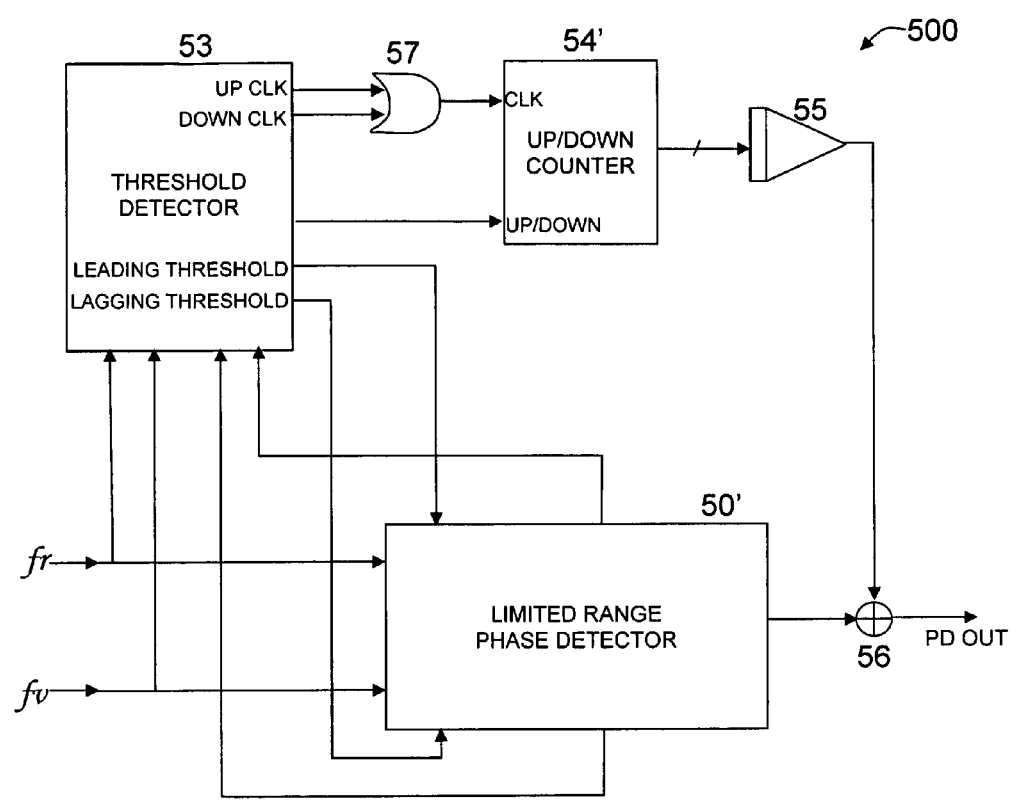
FIG. 5 is a generalized circuit block diagram of an enhanced phase detector possessing an extended linear range.

In some embodiments, as illustrated by the circuit block diagram of an example of an enhanced phase detector 500 in FIG. 5, the operations performed by the edge gates 51 and 52 (in FIG. 4) may be performed by devices within the limited range phase detector 50'. In such embodiments, the leading and lagging threshold output signals from the threshold detector 53 may serve as inputs to devices within the limited range detector 50'. In such implementations, it should be understood that minor modifications to the limited range phase detector 50' may be required. For example, terminals which were originally set to a constant logic level within the limited phase range detector 50', may receive the leading and lagging threshold output signals from the threshold detector 53.

In some embodiments, as illustrated in FIG. 5, the counter 54' may only receive a single clock signal CLK and a single UP/DOWN signal, where the UP/DOWN signal determines whether the counter 54' will increment or decrement the count upon the next edge of the clock signal CLK. In some embodiments, the threshold detector 53 may still comprise UP CLK and DOWN CLK outputs, which serve as inputs to an OR gate 42, and the output of the OR gate 57 in turn serves as the CLK input to the counter 54'.

In the illustration of FIG. 5 the phase detector 500 combines both the incorporation of edge gate functions within the limited range phase detector 50' and simplified inputs to the counter 54'. It should be further appreciated these variations need not both be implemented and may be implemented separately or in combination with further other modifications.

In the embodiments that follow, embodiments will be described utilizing a phase-frequency detector as the limited range phased detector.

Figure 6:
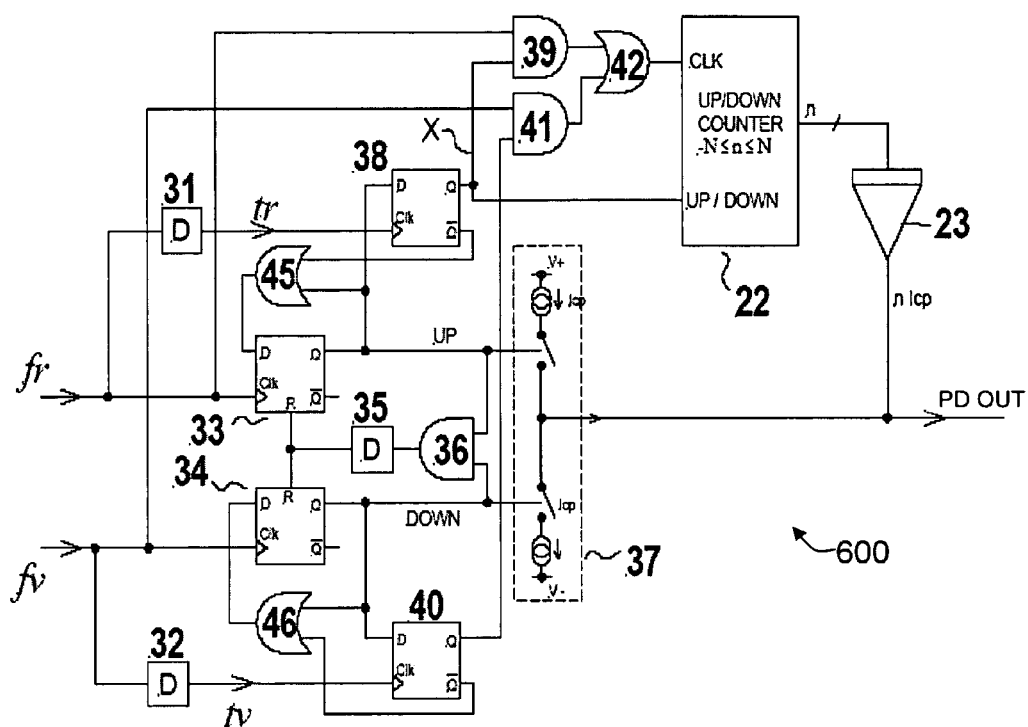
FIG. 6 is a circuit block diagram of an enhanced phase detector possessing an extended linear range.

In at least some embodiments, the phase range of the conventional phase-frequency detector that was shown in FIG. 2 is extended. An enhanced phase detector 600 is shown in FIG. 6, where latch 33, latch 34, gate 36 and delay element 35 combine to form a conventional PFD. As long as latches 38 and 40 are reset, the conventional PFD operates in the same manner as the circuit in FIG. 2. The UP and DOWN signals drive a current pump 37 which is connected to the phase detector output PD OUT. Hence, as long as the latches 38 and 40 are reset, and there is no output from the DAC 23, the enhanced phase detector 600 operates as a conventional PFD with a current pump.

There are two additional signals generated in the phase detector 600 in FIG. 6, tr and tv. The tr signal has a rising edge that occurs between each pair of fr rising edges, and is generated by delaying the fr signal with delay element 31. The tv signal has a rising edge that occurs between each pair of fv rising edges, and is generated by delaying the fv signal with the delay element 32. In some implementations it may be convenient to place the rising edge of tr midway between the fr rising edges and similarly the rising edge of tv midway between the fr rising edges, however the circuit gives useful performance over a wide range of relative timings between fr and tr, and between fv and tv.

The rising edges of the signals on the tr and tv lines determine the limit of phase errors allowed before an amount of $+2\pi$ or $-2\pi$ radians of phase will be added to the output in order to keep the phase detector 600 operating linearly. The time interval by which the tr edge lags the fr edge corresponds to the leading threshold discussed in reference to the embodiment in FIG. 4 Similarly the time interval by which the tv edge lags the fv edge corresponds to the lagging threshold.

The conventional PFD indicates a positive phase error if fr leads fv, causing pulses to appear on the UP line. The leading threshold event occurs if the UP line is still active when the next tr edge occurs, causing a $-2\pi$ radian adjustment to be made to the signals entering the conventional PFD. Similarly, a lagging threshold event occurs if the DOWN line is still active when the next tv edge occurs, causing a $+2\pi$ radian adjustment to be made to the signals entering the conventional PFD. If the tr edge occurs midway between fr edges, then this trigger occurs when a phase error of half a cycle, or $+\pi$ radians, occurs. By delaying tr, the allowable error increases, by advancing it, the allowable error decreases. Similarly, if the tv edge occurs midway between fv edges, then this phase error that triggers an adjustment is half a cycle, or $-\pi$ radians. By delaying tv, the magnitude of the allowable error increases; by advancing it, the magnitude decreases.

The operation of the embodiment in FIG. 6 for typical waveforms that would cause a cycle-slip in a conventional phase detector will now be explained, with the aid of the timing diagram in FIG. 7. The input signals fr and fv shown are such that the frequency of fv is lower than that of fr. The rising edges of the pulses tr have been shown to occur midway between the fr edges, but as has been mentioned, this is not essential for the operation of the circuit. The operation begins conventionally, with pulses of increasing width appearing on the UP line, indicating an increasing phase error. When the phase error exceeds the leading threshold, detected by the UP line being active at the time a tr rising edge occurs, latch 38 is activated, indicated by the signal X in FIG. 6 going HIGH. The activation of latch 38 does two things: first, it allows the D input of latch 33 to go LOW when the UP line is reset by the next fv edge, causing the conventional PFD to ignore the next rising edge on the fr line, and second, by enabling gate 39, it allows the next rising edge on fr to increment the counter 22. In this implementation, it is assumed that the active portions of fr and tr do not overlap, similarly for fv and tv.

Figure 7:
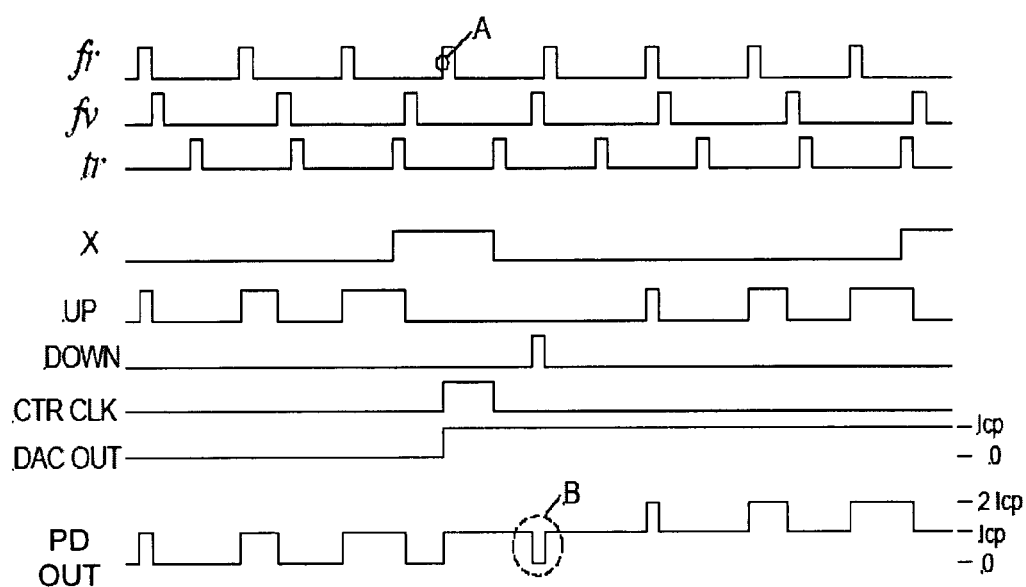
FIG. 7 is a series of graphs representing typical wave shapes at various points in the circuit of FIG. 6.

In FIG. 7, the edge on fr that is ignored by the conventional PFD is indicated by A. This edge does contribute $2\pi$ radians of phase to the output signal PD OUT (on the like-named terminal) by incrementing the counter 22 causing the output from the DAC 23 to increase by $I_{cp}$, as shown by the signal DAC OUT in FIG. 7.

After the edge labeled A in FIG. 7 has received this special treatment, the conventional PFD now sees a negative phase error, so the next edges result in a pulse on the DOWN line which produces a current from the charge pump 37 that subtracts the current from the DAC output during the period labeled B in FIG. 7.

The operation of the circuit continues in this fashion. At any time that the UP pulse gets too long (i.e., is still active when the tr edge occurs) an adjustment of $-2\pi$ radians is made by blocking an fr edge, and any time the DOWN pulse gets too long (i.e., still active when the tv edge occurs) an adjustment of $+2\pi$ radians is made by blocking an fv edge.

The adjustments are counted by the counter 22, which increments on the CLK rising edge when the UP/DOWN line is HIGH, and decrements on the CLK rising edge when the UP/DOWN line is LOW. The counter is arranged to count from $-N$ to $N$ and preferably saturates at the limits when further clock edges are detected. The output of the counter is connected to the DAC 23 which converts the counter output n to a current n×$I_{cp}$, where $I_{cp}$ is the current setting of the charge pump 37.

For the implementation shown in FIG. 6, where the counter 22 runs from −N to +N, the linear range of the phase detector exceeds −2Nπ to 2Nπ radians. Also note that because the 2π radian phase adjustments to the phase detector output are done synchronously with the fr and fv inputs, ideally the phase transfer characteristic is perfectly linear from −2Nπ to 2Nπ radians.

The purpose of the gates 45 and 46 is to ensure that the edges into the conventional PFD that are ignored (when either latch 38 or 40 is active) do not change the state of the PFD.

Note that the phase detector in FIG. 6 does not detect cycle slips, and in typical operation cycle slips will not occur. However, if the signals fr and fv are sufficiently removed in frequency, or if the edges of the pulses tr and tv are too close to the edges of fr and fv respectively, then cycle slips can still occur.

The particular arrangement in FIG. 6 requires that the signals fr and tr not be at logic '1' simultaneously, and similarly for the signals fv and tv. This restriction can be circumvented by redesigning the clock gating circuit (comprising AND gate 39, AND gate 41, and OR gate 42) to the counter 22.

It should also be appreciated that the timing accuracy of tr and tv is relatively non-critical, and any jitter on the tr and tv edges does not contribute to phase jitter from the phase detector. The tr and tv signals may be derived in a number of ways, including from the dividers generating fr and fv, or using delay elements or monostables.

Figure 8:
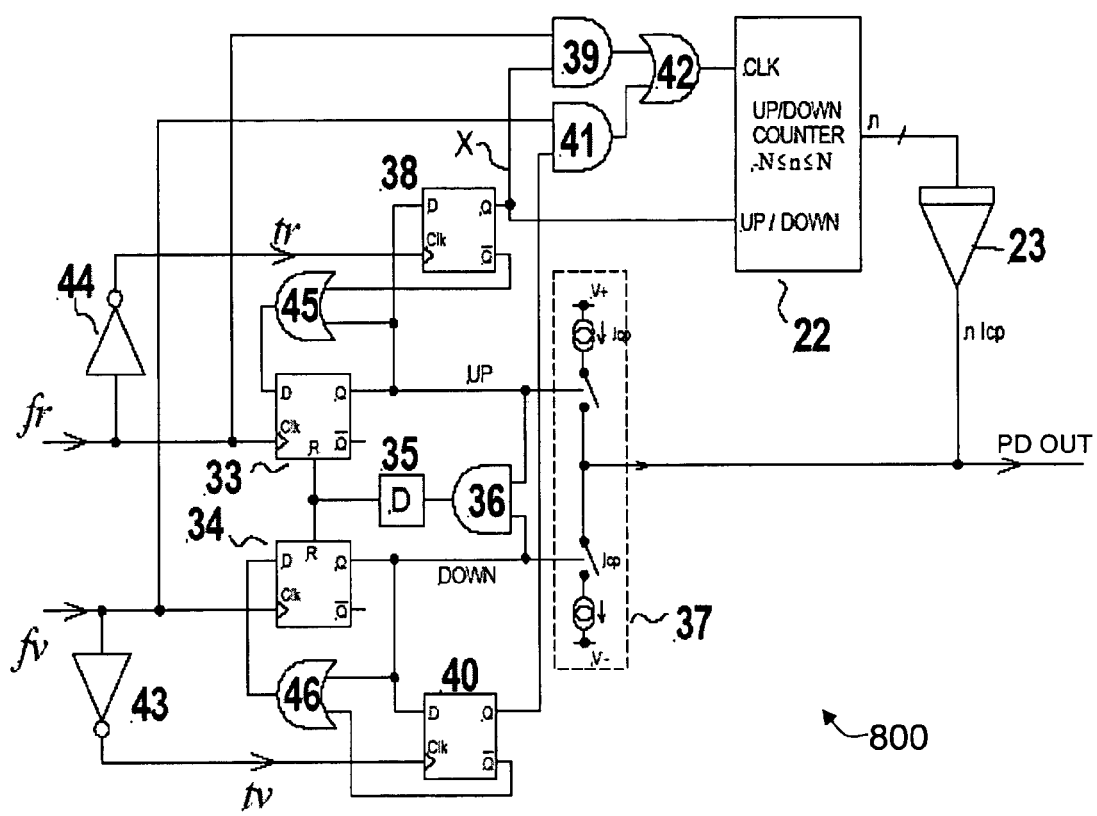
FIG. 8 is a circuit block diagram of an enhanced phase detector possessing an extended linear range and utilizing two inverters to generate threshold signals from two input signals.

A variation of the previous embodiment is shown in FIG. 8, where enhanced phase detector 800 comprises signals tv and tr generated using inverters 43 and 44. Such an embodiment may be appropriate when fv and fr have appropriate duty cycles.

Figure 9:
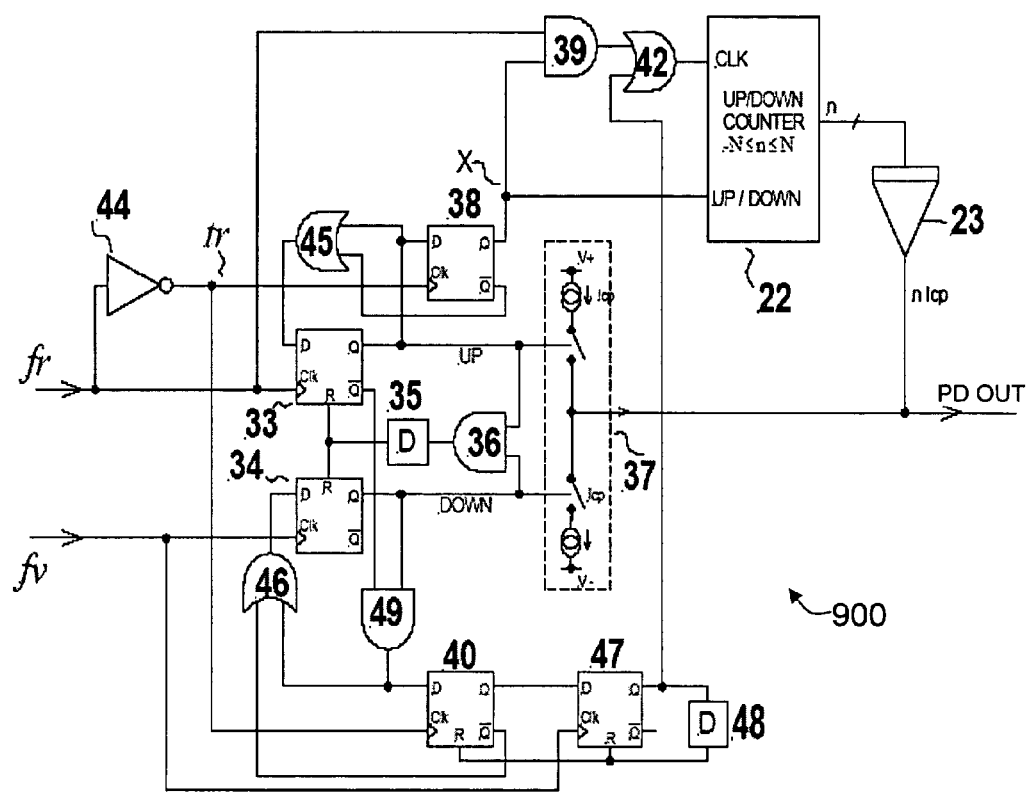
FIG. 9 is a circuit block diagram of an enhanced phase detector possessing an extended linear range and utilizing one inverter to generate threshold signals from one input signal.

In one type of embodiment, illustrated in FIG. 9, an enhanced phase detector 900 only comprises one of the signals tr or tv shown in the previous embodiment. Enhanced phased detector 900 generates a signal tr by inverting the fr signal with inverter 44. As in the previous embodiment, tr may be generated in other ways including using a delay element, a monostable or if fr is generated from a digital divider, it may be possible to derive a second phase of fr directly from the divider. For some applications it may be desirable to place the edge of tr mid-way between the rising edges of fr, but the circuit gives useful performance over a wide range of timing relationships between tr and fr.

The operation of the enhanced phase detector 900 in FIG. 9 is identical to the enhanced detector in FIG. 6 so far as the leading threshold detection is concerned. Specifically, the latch 38 is triggered if the UP signal is still active when the rising edge of tr occurs, resulting in the next rising edge of fr incrementing the counter 22 instead of setting the latch 33.

The operation of the lagging threshold detector is slightly different. The lagging threshold is now activated if the DOWN signal is active at the falling edge of fr. If this occurs it generally happens soon after the DOWN signal is activated, however this is an indication that the period of the DOWN signal will exceed the LOW period of fr, as the DOWN signal stays active until the rising edge of fr. Thus if the DOWN signal is active on the falling edge of fr, the threshold triggers and is latched by latch 40. The gate 49 is necessary as the falling edge of fr occurs asynchronously with fv, thus there is a possibility that it occurs when during the PFD dead zone after an UP pulse, when both UP and DOWN are active, awaiting for the reset signal to pass the gate 36 and delay element 35.

When the lagging threshold is detected, latch 40 is activated, which takes one input of gate 46 low, ensuring that the next fi edge is ignored by the conventional PFD, increasing the phase difference seen by the conventional PFD by 2π radians. The edge on fv that is ignored by the conventional PFD activates latch 47, the output of which decrements the counter 22 via gate 42. This causes the DAC 23 to decrease the phase detector output by an amount corresponding to this 2π radians. When latch 47 is activated, after a short period determined by the delay element 48, the latches 40 and 47 are reset, ready to await the next lagging threshold event. The delay element 48 is designed to be sufficient to avoid race conditions around latches 40 and 47 and to provide sufficient clock pulse width to counter 22.

It is appreciated that although the embodiment shown in FIG. 9 utilizes the falling edge of fr to provide the threshold settings, this could easily be done using the falling edge of fv.

Figure 10A:
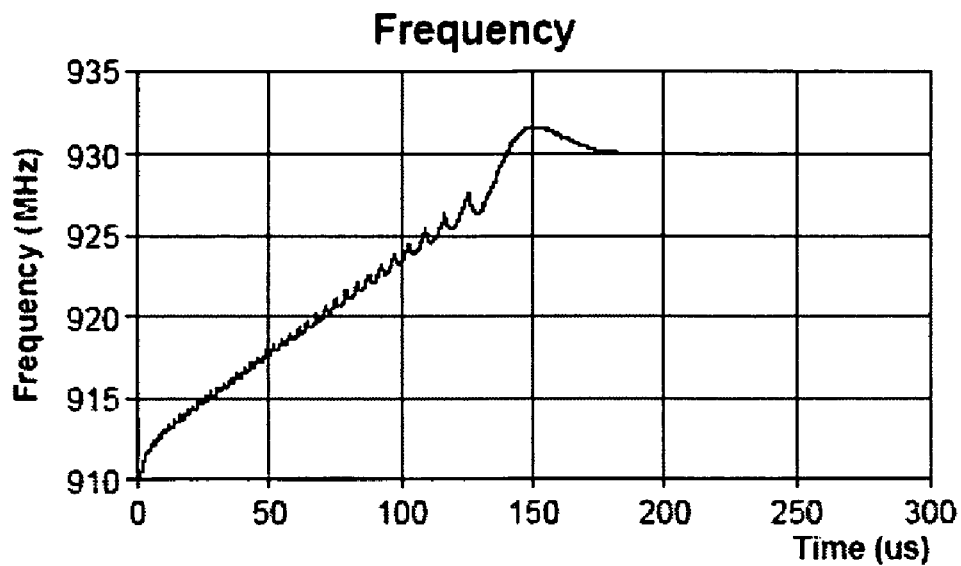
FIG. 10a is a graph of the output frequency of a PLL as a function of time for a PLL using the phase detector of FIG. 2.
Figure 10B:
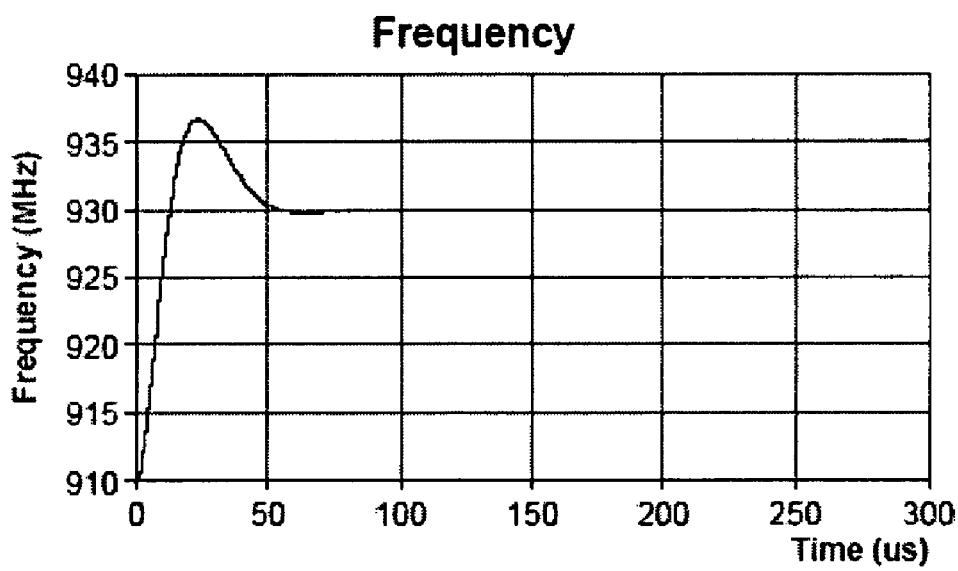
FIG. 10b is a graph of the output frequency of a PLL as a function of time for a PLL using the phase detector of FIG. 9.

To demonstrate the benefit the previous embodiment may provide to PLL acquisition time, FIG. 10a shows the expected (i.e., simulated) acquisition behavior of a PLL using the prior art PFD shown in FIG. 2. Making no other changes to the PLL other than to utilize the enhanced phase detector 900, shown in FIG. 9, results in the improved acquisition, as illustrated by the simulation results shown in FIG. 10b. In this instance, simulations indicated that the lock time is approximately halved.

Figure 11:
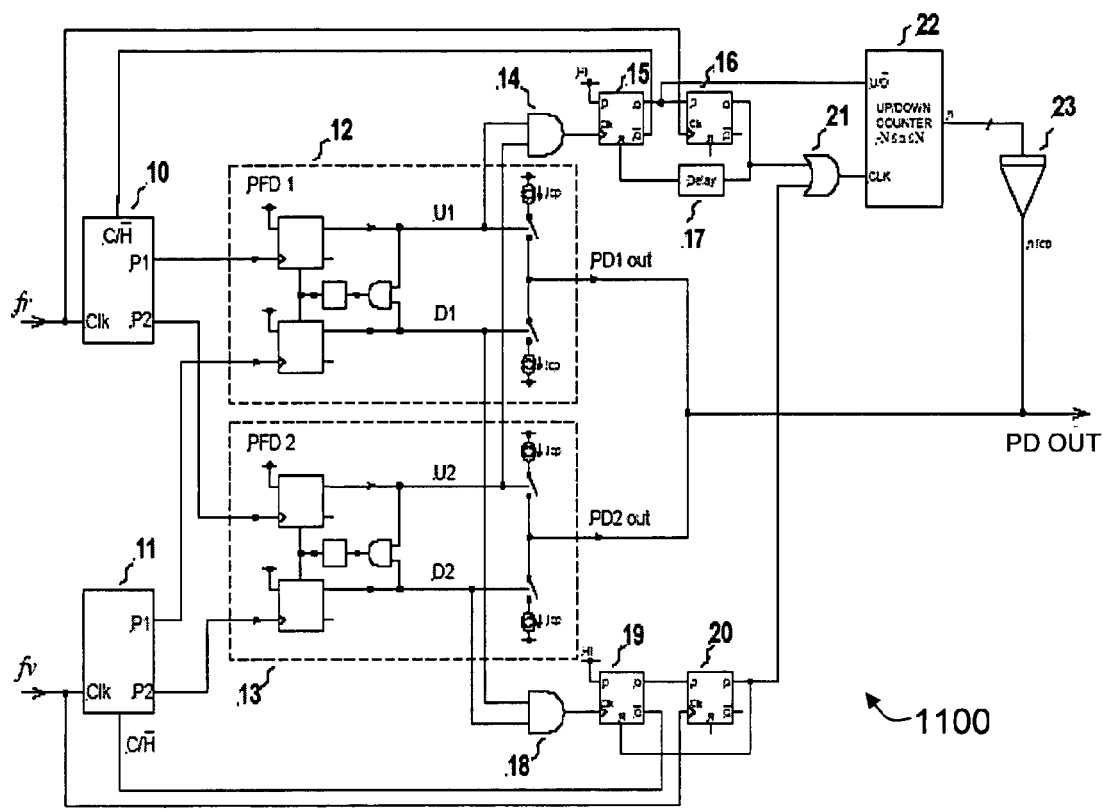
FIG. 11 is a circuit block diagram of an enhanced phase detector possessing an extended linear range and utilizing a basic phase detector possessing a linear range of $-4\pi$ to $+4\pi$ radians of phase difference.
Figure 12:
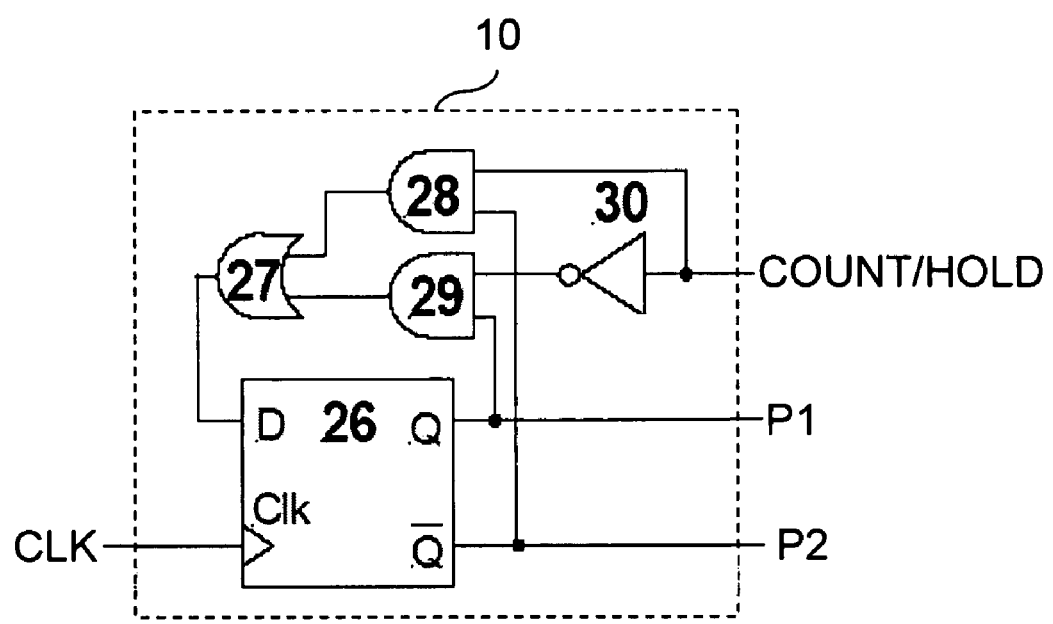
FIG. 12 is a circuit block diagram of the divide by 2 counters in the circuit of FIG. 11.

In another embodiment of the invention, shown in FIG. 11, the conventional phase detector whose range is being extended comprises a pair of conventional PFDs. In the enhanced phase detector 1100, the combination of input dividers 10 and 11 together with the conventional PFDs 12 and 13 constitute a basic phase detector (BPD) possessing a limited linear range, and will be referred to as such in the remainder of the description of this embodiment. So long as the latches 15 and 19 are reset, the COUNT/HOLD inputs to counters 10 and 11 are set to COUNT and so the counters 10 and 11 divide by two, and the BPD circuit provides a linear phase detection range from −4π to +4π radians. This BPD provides internal timing signals that allow for a suitable implementation of this embodiment without requiring the timing signals tr and tv.

As the BPD provides linear detection over a range from −4π to +4π radians, a convenient setting for the thresholds is achieved by performing 2π radian adjustments when the phase error in the BPD exceeds 2π radians, as implemented in the enhanced phase detector 1100.

The operation of the enhanced phase detector 1100 proceeds as follows. If the phase error exceeds +2π radians, this is detected by the U1 and U2 signals being active together. This event is triggered by an edge on fr activating one of U1 or U2 while the other is still active, and is detected by gate 14 and the rising edge captured by latch 15. Once latch 15 is set, the divider 10 is disabled from counting on the next fr edge; this edge, instead, clocks latch 16 active, providing a clock to the counter 22. This operation, in turn, causes counter 22 to increment, increasing the current output from DAC 23 by an amount Icp. The delay element 17 prevents race conditions from forming around latches 15, latches 16, gate 21 and counter 22, ensuring that the UP/DOWN control signal meets the setup and hold requirements of the counter 22.

Thus 2π radians of phase are removed from the input to the BPD by absorbing an edge in 10, while that edge contributes 2π radians of phase to the phase detector output by incrementing counter 22.

The circuit operates in a similar manner for phase differences around −2π radians, where the two DOWN lines clock latch 19, causing counter 11 to absorb an edge from fv, while that edge decrements the counter 22.

A suitable implementation of the pulse absorbing counters 10 and 11 is shown in FIG. 11. Latch 26 operates as a divide-by-two counter if the COUNT/HOLD input is HIGH, as the gates 27, 28, 29 and 30 result in the $\overline{Q}$ output being connected to the latch D input. If the COUNT/HOLD signal is taken LOW, the gates 27, 28, 29 and 30 result in the Q output being connected to the latch D input, resulting in the current counter state being held for any CLK edges that occur.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method of operating a phase detector to generate a signal indicative of a phase difference between a first input signal and a second input signal, the first input signal comprising a first sequence of edges, and the second input signal comprising a second sequence of edges, the method comprising:

with a limited range phase detector, generating a limited range phase difference between selected edges of the first and second input signals;

detecting an excursion of the limited range phase difference beyond a predetermined threshold;

in response to detecting the excursion of the limited range phase difference beyond the predetermined threshold, preventing an edge of the first or second input signal from influencing subsequent generation of the limited range phase difference; and with the phase detector, generating a compensated phase difference derived from the limited range phase difference and including a correction component which compensates for an effect of preventing an edge of the first or second input signal from influencing subsequent generation of the limited range phase difference.

2. The method of claim 1 wherein preventing an edge of the first or second input signal from influencing the subsequent generation of the limited range phase difference comprises preventing a next edge of the first or second input signal from influencing the subsequent generation of the limited range phase difference.

3. The method of claim 1 wherein preventing an edge of the first or second input signal from influencing the subsequent generation of the limited range phase difference comprises blocking the edge of the first or second input signal from generating a limited range phase difference.

4. The method of claim 1 wherein the correction component comprises a 2πn radian phase adjustment, where n is an integer.

5. The method of claim 1 wherein preventing an edge of the first or second input signal from influencing the subsequent generation of the limited range phase difference comprises preventing an edge of the first input signal from influencing subsequent generation of the limited range phase difference in response to detecting the excursion of the limited range phase difference beyond a leading threshold when the selected edges of the first input signal lead the selected edges of the second input signal.

6. The method of claim 5 further comprising incrementing an integer n for each edge prevented from influencing the subsequent generation of the limited range phase difference.

7. The method of claim 1 wherein preventing an edge of the first or second input signal from influencing the subsequent generation of the limited range phase difference comprises preventing an edge of the second input signal from influencing subsequent generation of the limited range phase difference in response to detecting the excursion of the limited range phase difference beyond a lagging threshold when the selected edges of the first input signal lag the selected edges of the second input signal.

8. The method of claim 7 further comprising decrementing an integer n for each edge prevented from influencing the subsequent generation of the limited range phase difference.

9. A phase detector circuit which generates a signal indicative of a phase difference between a first input signal and a second input signal, the first input signal comprising a first sequence of edges, and the second input signal comprising a second sequence of edges, comprising:

means for generating a limited range phase difference between selected edges of the first input signal and the second input signal;

means for determining if the limited range phase difference between selected edges of the first input signal and the second input signal exceeds a predetermined threshold;

means for preventing an edge of the first or second input signal from influencing subsequent generation of the limited range phase difference; and means for compensating the limited range phase difference, thereby generating a signal indicative of the phase difference between the first input signal and the second input signal.

10. The phase detector circuit of claim 9 wherein the means for preventing an edge of the first or second input signal from influencing subsequent generation of the limited range phase difference is at least partially contained within the means for generating a limited range phase difference between selected edges of the first input signal and the second input signal.

11. The phase detector circuit of claim 9 wherein the means for compensating the limited range phase difference comprises:

a means for updating a count, wherein the count is incremented in response to preventing an edge of the first input signal from influencing subsequent generation of the limited range phase difference and the count is decremented in response to preventing an edge of the second input signal from influencing subsequent generation of the limited range phase difference; and a means for adding the count and the limited range phase difference.

12. The phase detector circuit of claim 9 wherein the means for preventing an edge of the first or second input signal from influencing subsequent generation of the limited range phase difference is responsive to the means for determining if the limited range phase difference between selected edges of the first input signal and the second input signal exceeds a predetermined threshold.

13. A phase detector circuit configured to generate a signal indicative of a phase difference between a first input signal and a second input signal, the first input signal comprising a first sequence of edges, and the second input signal comprising a second sequence of edges, comprising:

a limited range phase detector generating a limited range phase difference between a first intermediate signal and a second intermediate signal;

a threshold detector determining if a phase difference between selected edges of the first input signal and the second input signal exceeds a predetermined threshold, wherein a first input of the threshold detector receives the first input signal and a second input of the threshold detector receives the second input signal, the threshold detector provides a first output when the phase difference between selected edges of the first input signal and the second input signal exceeds a leading threshold and the selected edges of the first input signal lead the selected edges of the second input signal, and the threshold detector provides a second output when the phase difference between selected edges of the first input signal and the second input signal exceeds a lagging threshold and the selected edges of the first input signal lag the selected edges of the second input signal;

a first edge gate connected to receive the first input signal and output the first intermediate signal, the first intermediate signal including edges of the first input signal except for one or more edges of the first input signal, blocked by the first edge gate in response to a signal applied to a control terminal of the first edge gate from the threshold detector; and a second edge gate connected to receive the second input signal and output the second intermediate signal, the second intermediate signal including edges of the second input signal except for one or more edges of the second input signal, blocked by the second edge gate in response to a signal applied to a control terminal of the second edge gate from the threshold detector.

14. The phase detector circuit of claim 13 wherein the limited range phase detector and the first and second edge gates share components.

15. The phase detector circuit of claim 13 further comprising:
a counter, wherein one or more inputs of the counter are operatively coupled to one or more outputs of the threshold detector.

16. The phase detector circuit of claim 15 further comprising:
a summing element operatively coupled to an output of the counter and an output of the limited range phase detector, to sum the output of the counter and the limited range phase detector.

17. The phase detector circuit of claim 13 wherein a third input of the threshold detector is operatively coupled to an UP line of the limited range phase detector.

18. The phase detector circuit of claim 17 wherein a fourth input of the threshold detector is operatively coupled to a DOWN line of the limited range phase detector.

19. In a phase locked loop having a phase detector, a loop filter and a voltage controlled oscillator arranged in a feedback loop, the improvement comprising:
the phase detector implementing a method of generating a signal indicative of a phase difference between a first input signal and a second input signal, the first input signal comprising a first sequence of edges, and the second input signal comprising a second sequence of edges, the method comprising
(a) generating a limited range phase difference between selected edges of the first and second input signals,
(b) detecting an excursion of the limited range phase difference beyond a predetermined threshold,
(c) in response to detecting the excursion of the limited range phase difference beyond the predetermined threshold, preventing an edge of the first or second input signal from influencing subsequent generation of the limited range phase difference, and
(d) generating a compensated phase difference derived from the limited range phase difference and including a correction component which compensates for an effect of preventing an edge of the first or second input signal from influencing subsequent generation of the limited range phase difference.

20. The phase locked loop of claim 19 wherein preventing an edge of the first or second input signal from influencing the subsequent generation of the limited range phase difference comprises preventing a next edge of the first or second input signal from influencing the subsequent generation of the limited range phase difference.

21. The phase locked loop of claim 19 wherein preventing an edge of the first or second input signal from influencing the subsequent generation of the limited range phase difference comprises blocking the edge of the first or second input signal from generating a limited range phase difference.

22. The phase locked loop of claim 19 wherein the correction component comprises a $2\pi n$ radian phase adjustment, where n is an integer.

23. The phase locked loop of claim 19 wherein preventing an edge of the first or second input signal from influencing the subsequent generation of the limited range phase difference comprises preventing an edge of the first input signal from influencing subsequent generation of the limited range phase difference in response to detecting the excursion of the limited range phase difference beyond a leading threshold when the selected edges of the first input signal lead the selected edges of the second input signal.

24. The phase locked loop of claim 23 further comprising incrementing an integer n for each edge prevented from influencing the generation of the limited range phase difference.

25. The phase locked loop of claim 19 wherein preventing an edge of the first or second input signal from influencing the subsequent generation of the limited range phase difference comprises preventing an edge of the second input signal from influencing subsequent generation of the limited range phase difference in response to detecting the excursion of the limited range phase difference beyond a lagging threshold when the selected edges of the first input signal lag the selected edges of the second input signal.

26. The phase locked loop of claim 25 further comprising decrementing an integer n for each edge prevented from influencing the generation of the limited range phase difference.

* * * * *